United States Patent
Lemak et al.

(10) Patent No.: US 8,059,408 B2
(45) Date of Patent: Nov. 15, 2011

(54) LAYERED HEAT SPREADER AND METHOD OF MAKING THE SAME

(75) Inventors: Richard James Lemak, Allentown, PA (US); V. N. P. Rao, Easton, PA (US)

(73) Assignee: Specialty Minerals (Michigan) Inc., Bingham Farms, MI (US)

( * ) Notice: Subject to any disclaimer, the term of this patent is extended or adjusted under 35 U.S.C. 154(b) by 692 days.

(21) Appl. No.: 12/206,214

(22) Filed: Sep. 8, 2008

(65) Prior Publication Data

US 2009/0095461 A1  Apr. 16, 2009

Related U.S. Application Data

(60) Provisional application No. 60/967,905, filed on Sep. 7, 2007.

(51) Int. Cl.
- *H05K 7/20* (2006.01)
- *F28F 21/02* (2006.01)
- *H01L 31/0368* (2006.01)
- *B21D 53/02* (2006.01)

(52) U.S. Cl. ........ 361/708; 165/185; 361/704; 428/339; 29/890.039

(58) Field of Classification Search .......... None
See application file for complete search history.

(56) References Cited

U.S. PATENT DOCUMENTS

| | | | |
|---|---|---|---|
| 5,155,652 A | 10/1992 | Logan et al. | |
| 5,390,734 A * | 2/1995 | Voorhes et al. | 165/185 |
| 6,407,922 B1 * | 6/2002 | Eckblad et al. | 361/704 |
| 7,297,399 B2 * | 11/2007 | Zhang et al. | 428/339 |
| 7,351,360 B2 * | 4/2008 | Hougham et al. | 252/502 |
| 2004/0001317 A1 | 1/2004 | Getz, Jr. et al. | |
| 2006/0112857 A1 | 6/2006 | Hougham et al. | |
| 2008/0085403 A1 * | 4/2008 | Sayir | 428/212 |
| 2008/0202386 A1 * | 8/2008 | Hougham et al. | 106/472 |

OTHER PUBLICATIONS

International Search Report dated Nov. 25, 2008 for PCT Application No. PCT/US08/10428.

* cited by examiner

*Primary Examiner* — Gregory Thompson (74) *Attorney, Agent, or Firm* — Derek S. Jessen; Leon Nigohosian, Jr.

(57) ABSTRACT

A heat spreader having at least two adjoining layers each having at least two pyrolytic graphite strips cut from a sheet of pyrolytic graphite along the z direction. Thermal conductivity in the xy plane of the graphite sheet is greater than in the z direction. The z direction cut provides strips which are each oriented 90 degrees such that the thickness direction of the original sheet becomes the width or length of the cut strip. A side of a first strip adjoins a side of a second strip in each layer. Because of the greater thermal conductivity in the xy plane of the strips as compared to the z direction heat transfers more rapidly in the length and thickness direction of the strips than across adjoining sides of the oriented strips in each layer. The first layer strips are oriented about 90 degrees from the orientation of the second layer strips.

18 Claims, 4 Drawing Sheets

LAYERED HEAT SPREADER AND METHOD OF MAKING THE SAME

BACKGROUND

The present invention relates to a heat spreader for conducting heat from a device and a method of making the heat spreader. Electronic components are becoming smaller while heat dissipation requirements are becoming greater. In order to dissipate heat generated by these electronic components, heat spreaders are utilized between the electronic component and a heat sink. Heat spreaders can be made of a solid thermally conductive metal. The solid conductive metal has a limited ability to spread heat and has limited thermal conductivity characteristics.

SUMMARY

According to the present invention, a heat spreader and a method for making the heat spreader is provided, and a method of dissipating from a heat source are disclosed.

In some embodiments, a heat spreader is provided which has at least a first layer and a second layer of strips or planar elements. At least one of the first layer and second layer has at least two adjoining planar elements or strips of pyrolytic graphite material and the other of the first layer or second layer has at least one strip. The direction of the orientation of the strips of the first layer is different from the direction of orientation of the strips of the second layer as described below.

The strips are made by cutting strips from a sheet of pyrolytic graphite such that the sheet has a cut therethrough in the z direction. Thermal conductivity in the xy plane of the pyrolytic graphite sheet is greater than in the z direction. The z direction cut provides strips which are then each individually oriented about 90 degrees such that the thickness direction of the original pyrolytic graphite sheet becomes the width or length of the cut strip. A portion of a lateral side of a first strip which has been formed by cutting the sheet of graphite and orienting the sheet about 90 degrees adjoins a face on the side of a second strip. Due to the greater thermal conductivity in the xy plane of the strips as compared to in the z direction heat transfers more rapidly along the length of a strip and in the thickness direction of the oriented strips than across a side of a strip which adjoins an adjoining strip in one layer of the spreader.

A first strip which is provided as described in the above paragraph above has a relatively high thermal conductivity in a direction of a first lateral dimension of the first strip and in a thickness direction of the strip and a relatively low thermal conductivity in a direction of a second lateral dimension of the first strip. A second strip which is provided as described in the above paragraph has a relatively high thermal conductivity in a direction of a first lateral dimension of the second strip and in a thickness direction of the second strip and a relatively low thermal conductivity in a direction of a second lateral dimension of the second strip. At least a portion of a first side of the first planar element which extends in a direction out of a first plane of the first planar element adjoins at least a portion of a second side of the second planar element which extends in a direction out of a second plane of the second planar element. The first strip and second strip thereby form a first layer of the heat spreader.

At least one additional strip is provided in a second layer of the heat spreader, for example, a third strip which is cut from a sheet of pyrolytic graphite such that the thickness dimension of the original sheet becomes the width or length of the third strip. The third strip of the second layer adjoins the first layer and is oriented such that the thickness direction of the first strip and second strip is oriented in about the same direction as the thickness direction of the third strip. The orientation of the direction of relatively low thermal conductivity of the first strip and second strip of the first layer is different relative to the orientation of the direction of relatively low thermal conductivity of the third strip. The component of the direction of relatively high thermal conductivity which is not in the thickness direction is also in a different orientation in the first strip and second strip relative to the component of the direction of relatively high thermal conductivity which is not in the thickness direction of the third strip.

Heat transfers in the thickness direction of the strips of the first layer to an adjoining strip of the second layer of the heat spreader due to the relatively high thermal conductivity of the first strip and second strip in the thickness direction of the first strip and second strip. Heat transferred from the first layer to the second layer transfers accordingly in the thickness direction of the third strip of the second layer due to the relatively high thermal conductivity of the third strip in the thickness direction.

In some embodiments of the invention the first side of a first strip of a first layer of the heat spreader adjoins the second side of a second strip of the first layer which is coextensive with the first side.

In some embodiments of the invention at least one of the first layer and second layer has three or more strips of substantially equal length are placed side by side. The second layer has at least one strip which adjoins the strips of the first layer.

In some embodiments of the invention a third layer of at least one strip, for example, a fourth strip, adjoins the second layer of the heat spreader. The orientation of the direction of relatively low thermal conductivity of the third strip of the second layer is different relative to the orientation of the direction of relatively low thermal conductivity of the fourth strip.

In some embodiments, the first strip and second strip are adjoined such that only a portion of a first side of the first strip adjoins only a portion of a second side of the second strip such that the first side of the first strip extends beyond the second side of the second strip.

Another embodiment of the invention is a method of making a heat spreader by providing at least two pyrolytic graphite strips or planar elements from a sheet of pyrolytic graphite in a first layer and at least one other strip in a second layer. The orientation of the direction of relatively low thermal conductivity of the strips of the first layer is different from the direction of relatively low thermal conductivity of the strips of the second layer. In order to provide the strips a cut is made in the thickness direction of the sheet which is known as the z direction. The thermal conductivity of the sheet in the z direction or as is commonly referred to as the c direction is relatively low as compared to the thermal conductivity in the xy plane or as is commonly referred to as the a directions or axes. The side of a first strip is then placed such that the side adjoins the side of a second strip. In this configuration heat transfers more rapidly along the length of the strip and in the thickness direction of the oriented strips than across a side of the strip which adjoins an adjacent strip.

Another embodiment of the invention is a method of placing the heat spreader in a heat conducting relationship with a heat source by providing adjoining pyrolytic graphite strips in a first layer of the heat spreader of the present invention. The side of a first strip is placed such that the side adjoins the side of a second strip. Heat transfers more rapidly along the length of the strip and in the thickness direction of the oriented strips than across a side of the strip which adjoins an adjacent strip. Heat is conducted from the heat source into the first strip and second strip of the first layer. Heat is conducted in the thickness direction of the at least one strips of the second layer which are oriented in a different direction that the strips of the first layer. Heat is conducted through the heat spreader in the direction of the a directions or axes of the pyrolytic graphite strips which is the direction in which the xy plane extends.

DETAILED DESCRIPTION OF THE INVENTION

The invention will now be described in detail by reference to the following specification and non-limiting examples.

Without further elaboration, it is believed that one skilled in the art can, using the preceding description, utilize the present invention to its fullest extent. The following embodiments are, therefore, to be construed as merely illustrative, and not limitative of the remainder of the disclosure in any way whatsoever.

Graphite is made up of layer planes of hexagonal arrays or networks of carbon atoms. These layer planes of hexagonal arranged carbon atoms are substantially flat and are oriented so as to be substantially parallel and equidistant to one another. The substantially flat parallel layers of carbon atoms are referred to as basal planes and are linked or bonded together in groups arranged in crystallites. Conventional or electrolytic graphite has a random order to the crystallites. Highly ordered graphite has a high degree of preferred crystallite orientation. Accordingly, graphite may be characterized as laminated structures of carbon having two principal axes, the "c" axis or direction which is generally identified as the axis or direction perpendicular to the carbon layers and the "a" axes or directions parallel to the carbon layers and transverse to the c axes.

Figure 1:
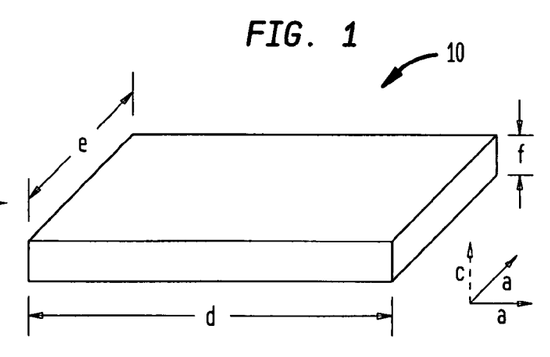
FIG. 1 is a parallel perspective view of a sheet of pyrolytic graphite for use in the present invention showing the direction of the a and c axes of the layers of pyrolytic graphite of the sheet.

Referring now to the drawings in detail, wherein like reference numerals indicate like elements through the several views, there is shown in FIG. 1 a sheet 10 for making the heat spreader of the present invention having axes a which are in the direction of the hexagonal array of carbon atoms. The c axis as shown is perpendicular to the carbon layers.

Graphite materials that exhibit a high degree of orientation include natural graphite and synthetic or pyrolytic graphite. Natural graphite is commercially available in the form of flakes (platelets) or as a powder. Pyrolytic graphite is produced by the pyrolysis of a carbonaceous gas on a suitable substrate at elevated temperature. Briefly, the pyrolytic deposition process may be carried out in a heated furnace and at a suitable pressure, wherein a hydrocarbon gas such as methane, natural gas, acetylene etc. is introduced into the heated furnace and is thermally decomposed at the surface of a substrate of suitable composition such as graphite having any desirable shape. The substrate may be removed or separated from the pyrolytic graphite. The pyrolytic graphite may then be further subjected to thermal annealing at high temperatures to form a highly oriented pyrolytic graphite commonly referred to as HOPG.

Figure 2:
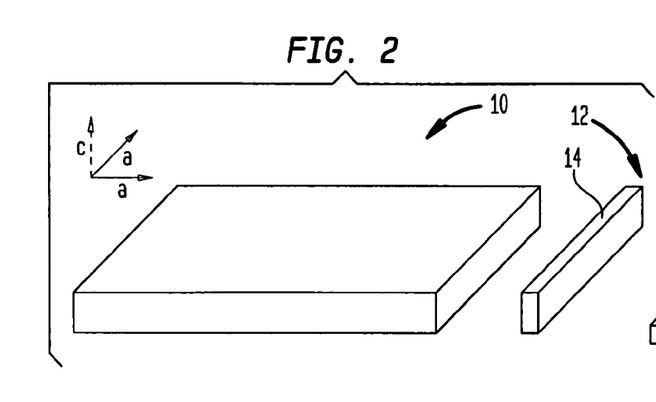
FIG. 2 is a parallel perspective view of the sheet of pyrolytic graphite of FIG. 1 showing a first planar element which has been diced from the sheet and separated therefrom.

In FIG. 2 is shown a sheet 10 of pyrolytic graphite having the direction of the a axes and the c axis as shown. A first planar element 12 or strip is cut or diced from the sheet 10 of pyrolytic graphite and after the first planar element 12 is cut from the sheet the direction of the a axes and c axis within the first planar element 12 remain in the same direction as when the first planar element 12 formed part of the sheet 10.

Figure 3A:
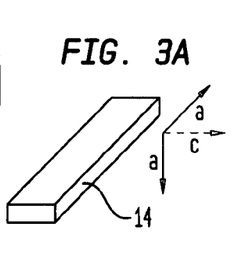
FIG. 3a shows the first planar element of FIG. 2 after orientation of about 90 degrees.
Figure 3B:
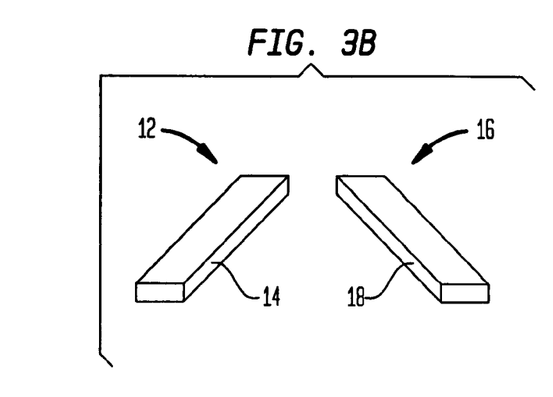
FIG. 3b shows the first planar element and the second planar element prior to adjoining.

Planar element 12 after being cut from sheet 10 is oriented about 90 degrees or about 270 degrees such that the direction of the c axis of the first planar element 12 changes from the direction shown in FIG. 2 to the direction shown in FIG. 3. Accordingly, it can be seen that after orientation of the first planar element 12 the relative location of first side 14 of first planar element 12 has changed from that shown in FIG. 2 to that shown in FIG. 3a. A second planar element 16 as shown in FIG. 3b is cut from sheet 10 and oriented 90 or 270 degrees in a manner similar to that described above for the first planar element 12.

Figure 5:
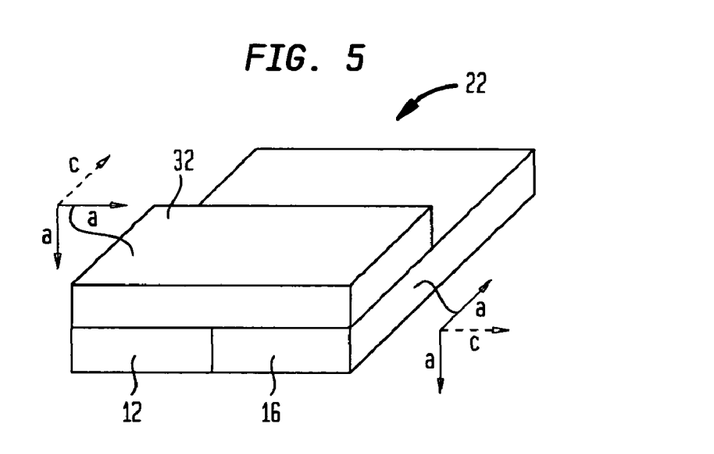
FIG. 5 shows an embodiment of the heat spreader of the present invention and the direction of the a and c axes of the pyrolytic graphite in the first planar element and second planar element.

According to an embodiment of the present invention, a first side 14 of first planar element 12 which is out of the plane of the plane of the first planar element 12 is adjoined with second side 18 of second planar element 16 which is out of the plane of the second planar element 16 such that at least a portion the first side 14 adjoins at least a portion of the second side 18 as seen in FIG. 5. A second layer first planar element 32 adjoins the first planar element 12 and is oriented such that the thickness direction of the first planar element 12 and second planar element 16 is oriented in about the same direction as the thickness direction of the second layer first planar element 32. The orientation of the direction of relatively low thermal conductivity of the first planar element 12 and second planar element 16 of the first layer is different relative to the orientation of the direction of relatively low thermal conductivity of the second layer first planar element 32. The component of the direction of relatively high thermal conductivity which is not in the thickness direction is also in a different orientation in the first planar element 12 and second planar element 16 relative to the component of the direction of relatively high thermal conductivity which is not in the thickness direction of the second layer first planar element 32.

Heat transfers in the thickness direction of the first planar element 12 and second planar element 16 of the first layer to an adjoining strip of the second layer, here second layer first planar element 32 of FIG. 5 of the heat spreader 22 due to the relatively high thermal conductivity of the first planar element 12 and second planar element 16 in the thickness direction of the first planar element 12 and second planar element 16. Heat transferred from the first layer to the second layer transfers accordingly in the thickness direction of the second layer first planar element 32 due to the relatively high thermal conductivity of the second layer first planar element in the thickness direction.

Figure 10:
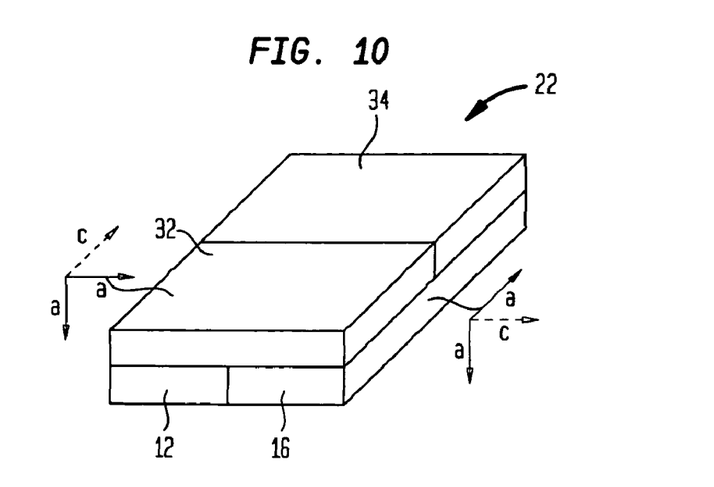
FIG. 10 shows another embodiment of the heat spreader of the present invention in which the area in which the first layer and second layer are adjoined is coextensive and each of the first layer and second layer has two planar elements.

In another embodiment of the invention as seen in FIG. 10, the first side 14 of the first planar element 12 can extend substantially coextensively with the second side 18 of the second planar element 16. Also, the portions of strips or planar elements of the second layer which adjoin the strips of the first layer can be the entire extent of the adjoining faces of the first layer and second layer strips.

In a similar way, heat spreaders of the present invention can be made with a fourth, fifth or sixth etc. planar element in each of the first layer and second layer. Each additional planar element of a particular layer has a side which adjoins an adjacent side of a planar element of the heat spreader in that particular layer.

Figure 4:
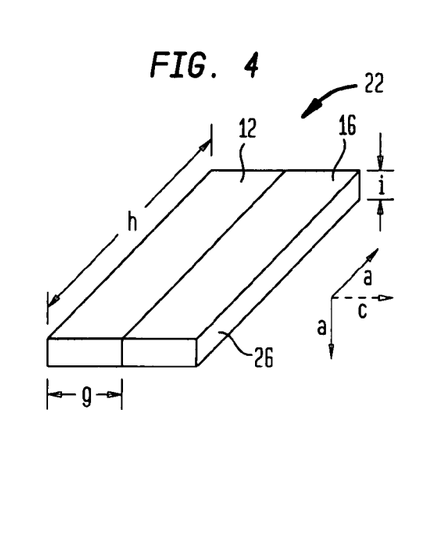
FIG. 4 shows a portion of an embodiment of the heat spreader of the present invention shown in FIG. 5 and the direction of the a and c axes of the pyrolytic graphite in the first planar element and second planar element.

As can be seen in FIGS. 4 and 5, the portion of the first side 14 of the first planar element 12 which adjoins the portion of the second planar element 16 extends substantially normal to the first plane of the first planar element 12. The first plane of the first planar element 12 is defined by the direction in which the major dimension h and minor dimension g extend as shown in FIG. 4. The major dimension h and minor dimension g can be of equal magnitude, however the major dimension h and minor dimension g are not the thickness dimension of the planar element.

The major dimension h and minor dimension g can be the first lateral dimension and second lateral dimensions of the first planar element 12.

The direction of the first lateral dimension or major direction h of the first planar element 12 and the thickness direction i of the first planar element 12 can be the direction of the a axes of the sheet 10 of pyrolytic graphite from which the first planar element 12 is formed. The direction of the second lateral dimension can be the direction of the c axis of the sheet 10 of pyrolytic graphite from which the first planar element 12 is formed as seen in FIG. 1. Therefore, as seen in FIG. 4, the first planar element 12 has a relatively high thermal conductivity in the first lateral dimension, here, major dimension h of the planar element and in the thickness direction i of the first planar element but a relatively low thermal conductivity in the second lateral dimension or minor dimension g. Therefore, heat is conducted more readily along major dimension h and in the thickness direction i than in minor dimension g than across first side 14 of first planar element 12 to second side 18 of second planar element 16.

The heat spreader of FIG. 5 can be made such that the planar elements each have three sets of parallel sides. Each side can be orthogonal to two other sides of the planar element. The two sides of each of the sides of a set can be spaced apart at substantially the same distance along each side.

The sheets of pyrolytic graphite from which the planar elements are cut or diced by any means for cutting the sheets such as wirecutting machines, dicing machines, or slicing machines are available in sizes having a thickness in the f dimension shown in FIG. 1 of from 0.2 millimeters up to 5 centimeters. A typical thickness is 1.3 centimeters. Commercially available pyrolytic graphite sheets are available having a length or d dimension of about 3 meters and the width dimension e can be as large as 40 centimeters. Pyrolytic graphite sheets suitable for use in the present invention are available from the Pyrogenics Group of Minteq International Inc. of New York, N.Y. An example is PYROID® HT pyrolytic graphite.

In one embodiment the distance in which the first side and the second side of the first planar element are spaced apart is at least about 1.5 millimeters.

In another embodiment the distance at which the first side and the second side of the first planar element are spaced apart is from about 1.5 millimeters to about 1.3 centimeters.

In another embodiment the distance at which the first side and the second side of the first planar element are spaced apart is from about 1.3 centimeters to about 2.5 centimeters.

In another embodiment the distance at which the first side and the second side of the first planar element are spaced apart is at least about 1.3 centimeters.

In another embodiment the distance at which the first side and the second side of the first planar element are spaced apart is at least about 4.0 centimeters.

In another embodiment the distance at which the first side and the second side of the first planar element are spaced apart is from about 1.3 centimeters to about 5.0 centimeters.

In another embodiment the distance at which the third side and the fourth side of the first planar element are spaced apart is at least about 1.0 centimeter.

In another embodiment the distance at which the third side and the fourth side of the first planar element are spaced apart is from about 1.0 centimeters to about 40 centimeters.

The distance at which the first and second sides of the second layer first planar element are spaced apart can be as set forth above. The distance at which the third and fourth sides of the second layer first planar element are spaced apart can be long enough to extend to across each of the first and second sides of the planar elements or strips of the first layer of the heat spreader as seen in FIG. 5. Each of the strips of the second layer can be long enough to extend across each of the first and second sides of the planar elements or strips of the first layer of the heat spreader as seen in FIG. 10.

The thermal conductivity of the sheets in the a axes of the sheets can be from about 450 to about 2000 Watts/m° K and the particular thermal conductivity for a particular application can be tailored. The thermal conductivity in the z direction or along the c axis can be as low as about 2.0 Watts/m° K or in the case of PYROID® HT pyrolytic graphite 7 Watts/m° K. By comparison the thermal conductivity of copper is 400 Watts/m° K. As copper has a density of 8.9 g/cc as compared to values for pyrolytic graphite of as high as 2.25 g/cc, greater efficiencies and weight savings can be achieved using the heat spreader of the present invention.

Thermal grease can be used at the interface between the first planar element 12 and second planar element 16. The heat spreader 22 of FIG. 6 can be adjoined to a substrate such as a heat sink, here a copper plate 20 as seen in FIG. 7 by any suitable means for adjoining the first planar element 12 and second planar element 16 to a substrate. In the event that the heat spreader 22 is adjoined to a heat sink the means for adjoining the heat spreader 22 to the substrate permits the transfer of heat from the heat spreader 22 to the substrate. A mechanical means such as a clamping means can be a means to adjoin the heat spreader to a substrate which in turn transfers heat from the heat spreader to a heat sink. Also, the heat spreader can be adjoined directly to a heat sink. Additional means for adjoining the heat spreader to a substrate or heat sink can be a bonding means. The bonding means can be a layer of metal or a layer which comprises metal on a planar element of the heat spreader which is bonded to the substrate such as by soldering at least a portion of the metal containing layer to the substrate or heat sink. The layer is applied to a planar element on at least a portion of the planar element which is to adjoin the substrate. After application of the metal containing layer on at least a portion of the planar element, the planar element can be adjoined to the substrate or heat sink by techniques used in the semiconductor industry such as soldering or even by a mechanical means such as a mechanical fastener.

Application of the metal containing layer on a portion of the planar element which adjoins the substrate can be achieved by metallization techniques, sputtering or by applying a layer of solder to the portion of the planar element which is to be joined to the substrate. The planar elements can be provided with a surface treatment prior to the application of the metal containing layer using techniques suitable for use on semiconductors.

Any means for joining the first planar element 12 and the second planar element 16 can be used. For example, a mechanical clamping means such as a mechanical fastener can be used to join the first planar element 12 and the second planar element 16 together or the first planar element 12 and the second planar element 16 can be soldered together using techniques which are capable of joining carbon-based surfaces together. Upon adjoining of the first planar element 12 and the second planar element 16 heat can transfer from the first planar element 12 and the second planar element 16 along the portion wherein the first planar element 12 and the second planar element 16 are adjoined. Strips or planar elements of adjoining planar elements of the second layer of the heat spreader can be soldered together or using techniques which are capable of joining carbon-based surfaces together. The adjoining strips or planar elements of the first layer which are joined to the second layer can be joined by any of the above mentioned techniques. Also, a metal-containing layer can be applied on a portion of a planar element of the first layer and a portion of a planar element of the second layer which are to be adjoined to each other. The application of a metal-containing layer can be achieved by metallization techniques, sputtering or by applying a layer of solder to the portion of the planar element which is to be joined to another planar element. The planar elements can be provided with a surface treatment prior to the application of the metal containing layer using techniques suitable for use on semiconductors.

Figure 11:
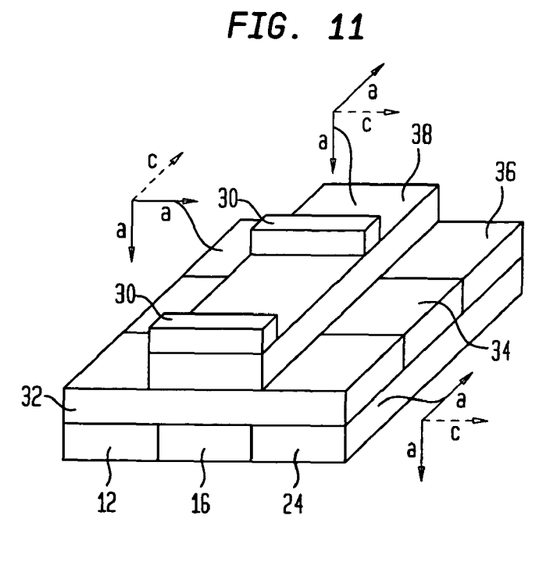
FIG. 11 shows another embodiment of the heat spreader of the present invention having three planar elements in each of the first layer and second layer and one planar element in the third layer of the heat spreader together with two electronic devices.

A particular planar element such as second layer first planar element 34 of FIG. 11 can have a metal containing layer applied to more than one, two, three or four faces in order that heat can be transmitted to all adjoining planar elements of the heat spreader.

Figure 6:
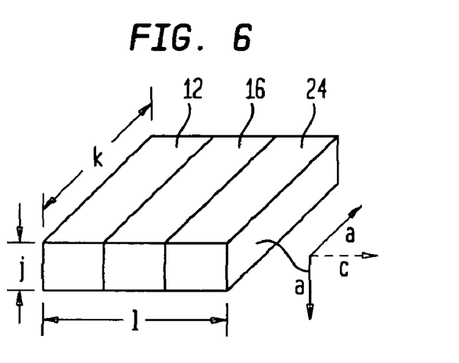
FIG. 6 shows a portion of another embodiment of the heat spreader of the present invention which has three planar elements in a first layer and the direction of the a and c axes of the pyrolytic graphite in the first planar element, second planar element and third planar element.
Figure 6A:
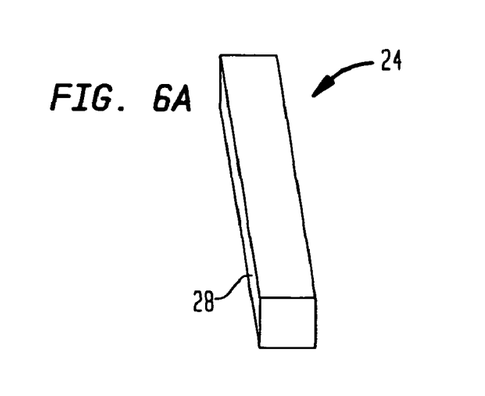
FIG. 6A shows the third planar element of the heat spreader of FIG. 6.
Figure 7:
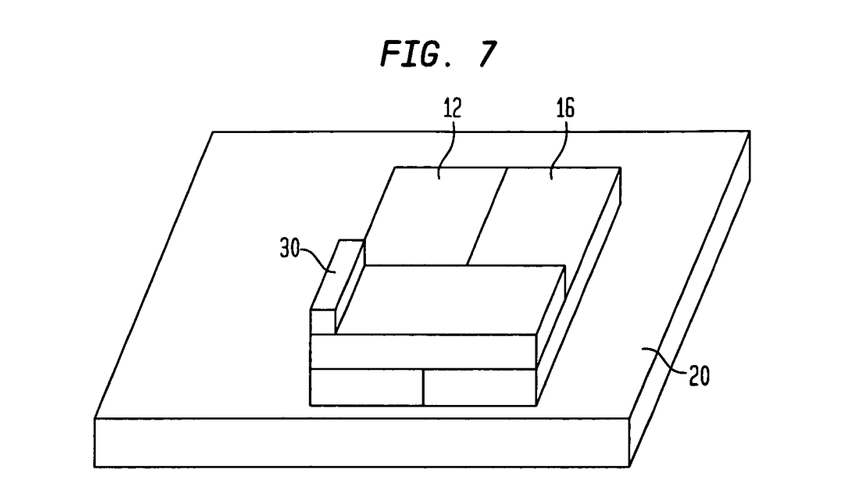
FIG. 7 shows another embodiment of the heat spreader of the present invention in combination with an electronic device and a heat sink.
Figure 8:
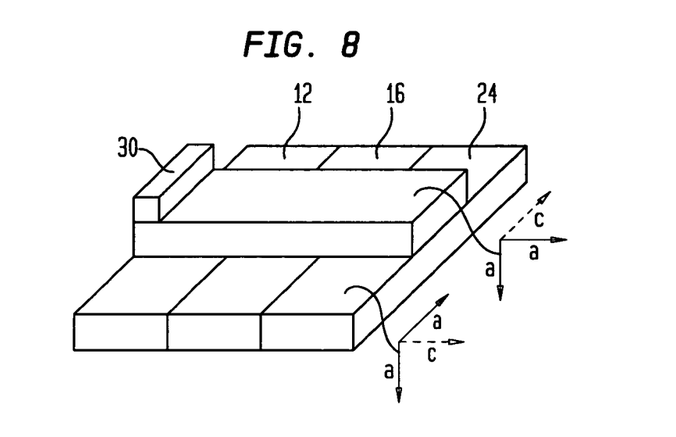
FIG. 8 shows another embodiment of the heat spreader of the present invention in combination with an electronic device.
Figure 9:
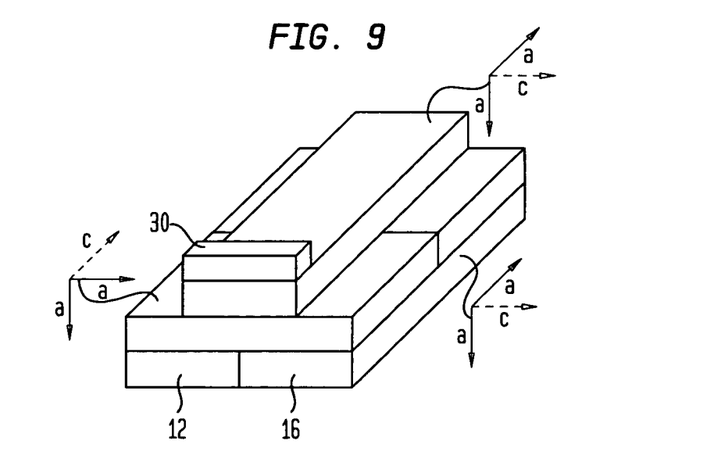
FIG. 9 shows another embodiment of the heat spreader of the present invention in combination with an electronic device the heat spreader having a first layer, second layer and a third layer.

In another embodiment of the present invention, a heat spreader has a first layer having a first planar element 12, a second planar element 16 and a third planar element 24 as seen in FIGS. 6 and 6A. The third planar element 24 is cut or diced from the sheet 10 of pyrolytic graphite and oriented in a manner similar to that in which the first planar element 12 and the second planar element 16 are cut. A third side 26 of second planar element 16 is arranged such that the third side 26 adjoins a fourth side 28 of third planar element 24. The second layer has a second layer first planar element 32, a second layer second planar element 34 and a second layer third planar element 36 as seen in FIG. 11. The heat spreader can have a third layer which has a third layer planar element 38 which is oriented such that the direction of relatively low thermal conductivity is at a substantially different direction with respect to the direction of relatively low thermal conductivity of the strips or planar elements of the second layer of the heat spreader which adjoins the third layer of the heat spreader.

In a similar way, heat spreaders of the present invention can be made with a fourth, fifth or sixth, etc. layer of planar elements. Each additional layer of planar elements has a side which adjoins an adjacent side of at least one planar element of an adjacent layer of planar elements of the heat spreader.

Because the a and c axes of the pyrolytic graphite of all three of the strips which make up this embodiment of the invention are arranged in the direction shown in FIG. 6, heat is transferred more readily in the j and k dimensions as compared to the l dimension.

In FIG. 7 a heat spreader of the present invention is shown in combination with an electronic device 30 and a heat sink 20 which is a copper plate. Heat from the electronic device 30 is transferred to the heat spreader 22. From the heat spreader 22, heat is transferred most rapidly in the direction of the thickness dimension i and in the direction of lateral dimension h which are oriented in the a axes of the pyrolytic graphite from which the heat spreader 22 is made. Heat is transferred less rapidly across the interface between the first planar element 12 and the second planar element 16.

The electronic device can be a microprocessor, an integrated circuit, high power devices such as laser diodes, LEDs, wide band gap, RF and microwave devices, power amplifiers, insulated gate bipolar transistors (IGBTs), application specific integrated circuits (ASICs), liquid crystal display (LCDs) and other types of video displays.

A heat spreader can dissipate heat from more than one electronic device such as seen in FIG. 11 in which two electronic devices 30 adjoin third layer planar element 38 and dissipate heat therefrom.

Figure 12:
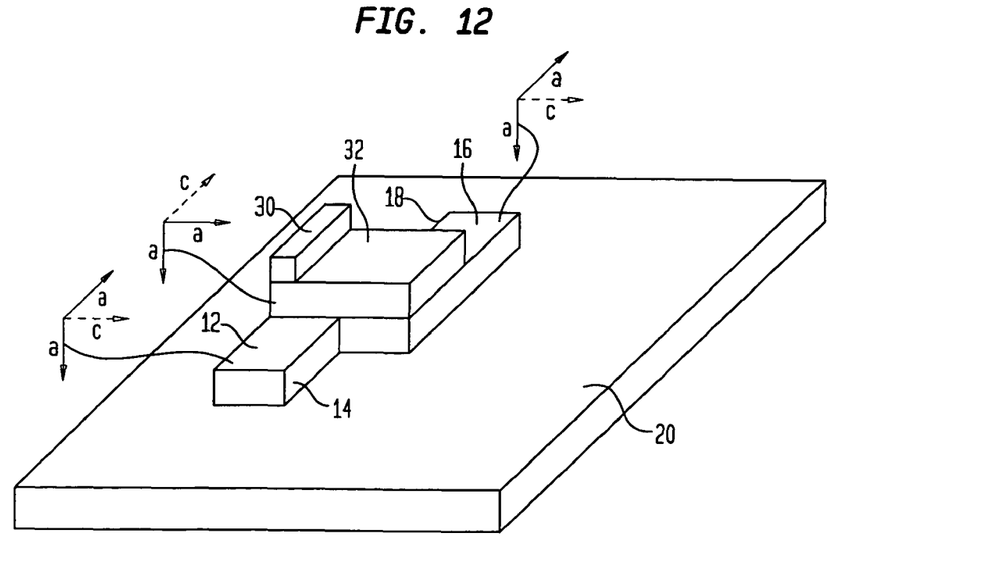
FIG. 12 shows another embodiment of the heat spreader of the present invention having in which the first side of a first planar element extends past the second side of a second planar element.

In another embodiment of the present invention the first layer first planar element 12 is offset from the first layer second planar element 16 as seen in FIG. 12. Only a portion of the first side 14 of the first layer first planar element 12 adjoins the second side 18 of the first layer second planar element 16. Similarly, only a portion of the second side 18 of the first layer second planar element 16 adjoins the first side 14 of the first layer first planar element 12. Second layer first planar element 32 adjoins a side of first layer first planar element 12 and second layer second planar element 16.

The invention also includes another embodiment disclosing a method of dissipating heat from a heat source comprising providing a heat spreader having a first planar element and second planar element arranged as described above in a first layer and a second layer first planar element. The heat spreader is placed in a heat conducting relationship with a heat source such that the heat spreader conducts heat from the heat source into the first strip and second strip. Heat is conducted through the heat spreader in the direction of relatively high thermal conductivity between the planar elements of the first layer and the at least one second layer first planar elements.

Accordingly, it is understood that the above description of the present invention is susceptible to considerable modifications, changes and adaptations by those skilled in the art, and that such modifications, changes and adaptations are intended to be considered within the scope of the present invention.

We claim:

1. A heat spreader comprising:
  a) a first planar element of pyrolytic graphite having a relatively high thermal conductivity in a direction of a first lateral dimension of a first plane of the first planar element and in a thickness direction of the first planar element and having a relatively low thermal conductivity in a direction of second lateral dimension of the first planar element, the first planar element having a first side which extends in a direction out of the first plane of the first planar element and a second side which extends in the direction of relatively high thermal conductivity of the first planar element,
  b) a second planar element of pyrolytic graphite having a relatively high thermal conductivity in a direction of a first lateral dimension of a second plane of the second planar element and in a thickness direction of the second planar element and having a relatively low thermal conductivity in a direction of a second lateral dimension of the second planar element, the second planar element having a third side which extends in a direction out of the second plane of the second planar element and a fourth side which extends in the direction of relatively high thermal conductivity of the second planar element,
  wherein at least a portion of the first side of the first planar element which extends in a direction out of the first plane of the first planar element adjoins at least a portion of the third side of the second planar element which extends in a direction out of the second plane of the second planar element, and
  c) a third planar element of pyrolytic graphite having a relatively high thermal conductivity in a direction of a first lateral dimension of a third plane of the third planar element and in a thickness direction of the third planar element and having a relatively low thermal conductivity in a direction of a second lateral dimension of the third planar element, the third planar element having a fifth side which extends in the direction of relatively high thermal conductivity of the third planar element, the fifth side of the third planar element adjoining the second side of the first planar element and the fourth side of the second planar element, and the orientation of the direction of relatively low thermal conductivity of the first planar element and second planar element is at a different angle with respect to the direction of relatively low thermal conductivity of the third planar element.

2. A heat spreader comprising:
  a) a first planar element of pyrolytic graphite having a relatively high thermal conductivity in a direction of a first lateral dimension of a first plane of the first planar element and in the thickness direction of the first planar element and having a relatively low thermal conductivity in a direction of second lateral dimension of the first planar element, wherein the direction of the first lateral dimension of the first plane of the first planar element and the thickness direction of the first planar element extend substantially in directions of orientation of a axes of the pyrolytic graphite of the first planar element and the direction of the second lateral dimension of the first planar element extends substantially in the direction of the c axis of the pyrolytic graphite of the first planar element, the first planar element having a first side which extends in a direction out of the first plane of the first planar element and a second side which extends in the direction of relatively high thermal conductivity of the first planar element,
  b) a second planar element of pyrolytic graphite having a relatively high thermal conductivity in a direction of a first lateral dimension of a second plane of the second planar element and in the thickness direction of the second planar element and having a relatively low thermal conductivity in a direction of a second lateral dimension of the second planar element, wherein the direction of the first lateral dimension of the second plane of the second planar element and the thickness direction of the second planar element extend substantially in directions of orientation of a axes of the pyrolytic graphite of the second planar element and the direction of the second lateral dimension of the second planar element extends substantially in the direction of the c axis of the pyrolytic graphite of the second planar element, the second planar element having a third side which extends in a direction out of the second plane of the second planar element and a fourth side which extends in the direction of relatively high thermal conductivity of the second planar element,
  wherein at least a portion of a first side of the first planar element which extends in a direction out of the first plane of the first planar element adjoins at least a portion of a third side of the second planar element which extends in a direction out of the second plane of the second planar element, and
  c) a third planar element of pyrolytic graphite having a relatively high thermal conductivity in a direction of a first lateral dimension of a third plane of the third planar element and in a thickness direction of the third planar element and having a relatively low thermal conductivity in a direction of a second lateral dimension of the third planar element, wherein the direction of the first lateral dimension of the third plane of the third planar element and the thickness direction of the third planar element extend substantially in directions of orientation of a axes of the pyrolytic graphite of the third planar element and the direction of the second lateral dimension of the third planar element extends substantially in the direction of the c axis of the pyrolytic graphite of the third planar element, the third planar element having a fifth side which extends in the direction of relatively high thermal conductivity of the third planar element, the fifth side of the third planar element adjoining the second side of the first planar element and the fourth side of the second planar element, and the orientation of the direction of relatively low thermal conductivity of the first planar element and second planar element is at a different angle with respect to the direction of relatively low thermal conductivity of the third planar element.

3. The heat spreader according to claim 2 wherein each of the first side of the first planar element and the third side of the second planar element each have a substantially parallel opposing side which is spaced apart from each of the first side and third side respectively in the direction of the second lateral dimension at a first distance, and each of the second side of the first planar element and the fourth side of the second planar element each have a substantially parallel opposing side which is spaced apart from each of the first side and third side respectively in the direction of the first lateral dimension at a second distance, wherein the first side of the first planar element is orthogonal to the second side of the first planar element and the third side of the second planar element is orthogonal to the fourth side of the second planar element.

4. The heat spreader according to claim 3 wherein the first side of the first planar element substantially coextensively adjoins the third side of the second planar element.

5. The heat spreader according to claim 4 wherein the fifth side of the third planar element extends from the first side of the first planar element to the opposing side of the first side of the first planar element and from the third side of the second planar element to the opposing side of the third side of the second planar element.

6. The heat spreader according to claim 5 wherein the third planar element has a sixth side substantially normal to the fifth side of the third planar element and wherein the heat spreader further comprises a fourth planar element of pyrolytic graphite having a relatively high thermal conductivity in a direction of a first lateral dimension of a fourth plane of the fourth planar element and in a thickness direction of the fourth planar element and having a relatively low thermal conductivity in a direction of a second lateral dimension of the fourth planar element, wherein the direction of the first lateral dimension of the fourth plane of the fourth planar element and the thickness direction of the fourth planar element extend substantially in directions of orientation of a axes of the pyrolytic graphite of the fourth planar element and the direction of the second lateral dimension of the fourth planar element extends substantially in the direction of the c axis of the pyrolytic graphite of the third planar element, the fourth planar element having a seventh side which extends in the direction of relatively high thermal conductivity of the fourth planar element, the seventh side of the fourth planar element adjoining the second side of the first planar element and the fourth side of the second planar element, and the orientation of the direction of relatively low thermal conductivity of the first planar element and second planar element is at a different angle with respect to the direction of relatively low thermal conductivity of the fourth planar element, the fourth planar element having an eighth side substantially normal to the seventh side which coextensively adjoins the sixth side of the third planar element.

7. The heat spreader according to claim 4 wherein the second planar element has a side opposing the third side of the second planar element and wherein the heat spreader further comprises a fourth planar element of pyrolytic graphite having a relatively high thermal conductivity in a direction of a first lateral dimension of a fourth plane of the fourth planar element and in the thickness direction of the fourth planar element and having a relatively low thermal conductivity in a direction of second lateral dimension of the fourth planar element, wherein the direction of the first lateral dimension of the fourth plane of the fourth planar element and the thickness direction of the fourth planar element extend substantially in directions of orientation of a axes of the pyrolytic graphite of the fourth planar element and the direction of the second lateral dimension of the fourth planar element extends substantially in the direction of the c axis of the pyrolytic graphite of the fourth planar element, the fourth planar element having a seventh side which extends in a direction out of the fourth plane of the fourth planar element and a eighth side which extends in the direction of relatively high thermal conductivity of the fourth planar element, wherein at least a portion of a seventh side of the fourth planar element which extends in a direction out of the fourth plane of the fourth planar element adjoins at least a portion of the side opposite the third side of the second planar element which extends in a direction out of the second plane of the second planar element.

8. The heat spreader according to claim 6 further comprising a fifth planar element of pyrolytic graphite extending across the third planar element and the fourth planar element wherein the fifth planar element has a relatively high thermal conductivity in a direction of a first lateral dimension of a fifth plane of the fifth planar element and in a thickness direction of the fifth planar element and having a relatively low thermal conductivity in a direction of a second lateral dimension of the fifth planar element, the fifth planar element having a ninth side which extends in the direction of relatively high thermal conductivity of the fifth planar element, the ninth side of the fifth planar element adjoining a side of the third planar element opposing the fifth side of the third planar element and adjoining a side of the fourth planar element opposing the seventh side of the fourth planar element, and the orientation of the direction of relatively low thermal conductivity of the third planar element and fourth planar element is at a different angle with respect to the direction of relatively low thermal conductivity of the fifth planar element.

9. The heat spreader of claim 1 in combination with an electronic device, wherein the electronic device is provided on the third planar element of the heat spreader and the heat spreader conducts heat from the electronic device.

10. The heat spreader of claim 1 in combination with an electrical device and a heat sink, wherein the electronic device is provided on the third planar element of the heat spreader and the heat spreader conducts heat from the electrical device to the heat sink.

11. The heat spreader of claim 1 in combination with a heat sink wherein the heat spreader is provided on the heat sink.

12. The heat spreader according to claim 3 wherein the first distance between the first side of the first planar element and the opposing side of the first side and the third side of the second planar element and the opposing side of the third side is at least about 1.5 millimeters.

13. The heat spreader according to claim 3 wherein the first distance between the first side of the first planar element and the opposing side of the first side and the third side of the second planar element and the opposing side of the third side is from about 1.5 millimeters to about 1.3 centimeters.

14. The heat spreader according to claim 3 wherein the first distance between the first side of the first planar element and the opposing side of the first side and the third side of the second planar element and the opposing side of the third side is from about 1.3 centimeters to about 2.5 centimeters.

15. The heat spreader according to claim 3 wherein the second distance between the second side of the first planar element and the opposing side of the second side is at least about 1.0 centimeter.

16. The heat spreader according to claim 3 wherein the second distance between the second side of the first planar element and the opposing side of the second side is from about 1.0 centimeters to about 40 centimeters.

17. A method of making the heat spreader of claim 1 comprising the steps of:

a) providing a first planar element of pyrolytic graphite having a relatively high thermal conductivity in a direction of a first lateral dimension of a first plane of the first planar element and in a thickness direction of the first planar element and having a relatively low thermal conductivity in a direction of second lateral dimension of the first planar element, the first planar element having a first side which extends in a direction out of the first plane of the first planar element and a second side which extends in the direction of relatively high thermal conductivity of the first planar element, b) providing a second planar element of pyrolytic graphite having a relatively high thermal conductivity in a direction of a first lateral dimension of a second plane of the second planar element and in a thickness direction of the second planar element and having a relatively low thermal conductivity in a direction of a second lateral dimension of the second planar element, the second planar element having a third side which extends in a direction out of the second plane of the second planar element and a fourth side which extends in the direction of relatively high thermal conductivity of the second planar element, c) adjoining at least a portion of the first side of the first planar element which extends in a direction out of the first plane of the first planar element to at least a portion of the third side of the second planar element which extends in a direction out of the second plane of the second planar element, and d) providing a third planar element of pyrolytic graphite having a relatively high thermal conductivity in a direction of a first lateral dimension of a third plane of the third planar element and in a thickness direction of the third planar element and having a relatively low thermal conductivity in a direction of a second lateral dimension of the third planar element, the third planar element having a fifth side which extends in the direction of relatively high thermal conductivity of the third planar element, e) adjoining the fifth side of the third planar element to the second side of the first planar element and the fourth side of the second planar element, such that the orientation of the direction of relatively low thermal conductivity of the first planar element and second planar element is at a different angle with respect to the direction of relatively low thermal conductivity of the third planar element.

18. A method of dissipating heat from a heat source, comprising:

a) providing a heat spreader comprising:

ii) a first planar element of pyrolytic graphite having a relatively high thermal conductivity in a direction of a first lateral dimension of a first plane of the first planar element and in a thickness direction of the first planar element and having a relatively low thermal conductivity in a direction of second lateral dimension of the first planar element, the first planar element having a first side which extends in a direction out of the first plane of the first planar element and a second side which extends in the direction of relatively high thermal conductivity of the first planar element, ii) a second planar element of pyrolytic graphite having a relatively high thermal conductivity in a direction of a first lateral dimension of a second plane of the second planar element and in a thickness direction of the second planar element and having a relatively low thermal conductivity in a direction of a second lateral dimension of the second planar element, the second planar element having a third side which extends in a direction out of the second plane of the second planar element and a fourth side which extends in the direction of relatively high thermal conductivity of the second planar element, wherein at least a portion of the first side of the first planar element which extends in a direction out of the first plane of the first planar element adjoins at least a portion of the third side of the second planar element which extends in a direction out of the second plane of the second planar element, and iii) a third planar element of pyrolytic graphite having a relatively high thermal conductivity in a direction of a first lateral dimension of a third plane of the third planar element and in a thickness direction of the third planar element and having a relatively low thermal conductivity in a direction of a second lateral dimension of the third planar element, the third planar element having a fifth side which extends in the direction of relatively high thermal conductivity of the third planar element, the fifth side of the third planar element adjoining the second side of the first planar element and the fourth side of the second planar element, and the orientation of the direction of relatively low thermal conductivity of the first planar element and second planar element is at a different angle with respect to the direction of relatively low thermal conductivity of the third planar element, b) placing the heat spreader in heat conducting relationship with a heat source;

c) conducting heat from the heat source into the first planar element and second planar element and from the first planar element and second planar element to the third planar element; and d) conducting heat through the heat spreader in the direction of relatively high thermal conductivity.

* * * * *